United States Patent [19]

Yamamoto

[11] Patent Number: 5,432,117
[45] Date of Patent: Jul. 11, 1995

[54] METHOD OF PRODUCING SEMICONDUCTOR DEVICE

[75] Inventor: Kouji Yamamoto, Kyoto, Japan

[73] Assignee: Rohm Co., Ltd., Kyoto, Japan

[21] Appl. No.: 247,342

[22] Filed: May 23, 1994

[30] Foreign Application Priority Data

Jun. 11, 1993 [JP] Japan ................... 5-166411

[51] Int. Cl.⁶ .................................... H01L 21/76
[52] U.S. Cl. ................................ 437/69; 437/70; 437/72; 437/73; 148/DIG. 106
[58] Field of Search ............ 437/69, 70, 72, 73, 437/61

[56] References Cited

U.S. PATENT DOCUMENTS

| | | | |
|---|---|---|---|
| 3,899,363 | 8/1975 | Dennard et al. | 437/70 |
| 4,044,454 | 8/1977 | Magdo | 437/69 |
| 4,085,498 | 4/1978 | Rideout | 437/69 |
| 4,160,987 | 7/1979 | Denard et al. | 437/69 |
| 4,354,309 | 10/1982 | Gardiner et al. | 437/70 |
| 4,373,965 | 2/1983 | Smigelski | 437/70 |
| 4,426,764 | 1/1984 | Kosa et al. | 437/70 |
| 4,484,979 | 11/1984 | Stoker | 437/61 |
| 4,812,418 | 3/1989 | Pfiester et al. | 437/69 |

FOREIGN PATENT DOCUMENTS

| | | | |
|---|---|---|---|
| 0054576 | 4/1979 | Japan | 437/70 |
| 56-70644 | 6/1981 | Japan . | |
| 0283147 | 12/1986 | Japan | 437/69 |
| 0035532 | 2/1987 | Japan | 437/70 |
| 0136349 | 5/1989 | Japan | 437/69 |
| 2-260639 | 10/1990 | Japan . | |

OTHER PUBLICATIONS

"An Improved LOCOS Technology Using Thin Oxide and Polysilicon Buffer Layers", by N. Hoshi et al., pp. 78–83, with English-language abstract.

Primary Examiner—Brian E. Hearn
Assistant Examiner—Trung Dang
Attorney, Agent, or Firm—Brumbaugh, Graves, Donohue & Raymond

[57] ABSTRACT

An insulating film and a silicon nitride film are formed on a semiconductor substrate. A resist film is patterned on the silicon nitride film. Thereafter, using the patterned resist film as a mask, the silicon nitride film is removed in such a manner that the film thickness is the maximum at its center portion and becomes gradually small downwardly in the neighborhood of the ends of the resist film pattern. The silicon nitride film which is thick at its center portion is adopted as a mask for selective oxidation.

5 Claims, 3 Drawing Sheets

METHOD OF PRODUCING SEMICONDUCTOR DEVICE

BACKGROUND OF THE INVENTION

The present invention relates to a method of producing a semiconductor device.

Conventionally, in order to form an element isolation area in the production of a semiconductor device, the LOCOS (Local Oxidation of Silicon) method has been used. As shown in FIGS. 4(a) to 4(c), the LOCOS method is a technique of laminating an oxidized insulating film ($SiO_2$) 51 and a silicon nitride film 52 on a silicon (Si) substrate 50 (FIG. 4(a)), and selectively oxidizing silicon using as a mask the patterned silicon nitride film 53 to form a thick silicon oxide film 54 (FIGS. 4(b) and 4(c)). In this method, as shown in FIG. 4(c), the silicon oxide film 54 extends long and thin from the boundary of the element isolation area to an active area 55 for formation of an element (the extended area is referred to as a bird's beak). This bird's beak narrows the active area. Thus, in order to prevent the bird's beak from being generated, an improved LOCOS method has been proposed in which polycrystalline silicon (poly-Si) is used as a buffer film as shown in FIGS. 5(a) to 5(c) (see Japanese Patent Unexamined Publication No. Hei 2-260639). In this improved method, a poly-Si film 62 is formed on a silicon oxide film 61 on a Si substrate 60, and a silicon nitride film 63 is patterned on the poly-Si film 62 (FIGS. 5(a) and 5(b)). Using the silicon nitride film 63 as a mask and a partially remaining poly-Si film 64 as a buffer film, selective oxidation is performed. According to this method, the silicon oxide film 61 and the poly-Si film 64 are so combined that the poly-Si film 64 absorbs, scatters and relaxes the stress generated during the selective oxidation. As a result, the silicon oxide films 65 are prevented from being extended to an active area 66 (FIG. 5(c)).

As one current in development of semiconductor integration technology, miniaturization of patterns has been required. As described in connection with FIGS. 4(a) to 4(c), the conventional LOCOS has a problem that it generates the bird's beak to reduce the active area, thereby hindering miniaturization. Thus, a technique of canceling the bird's beak was proposed. In this technique, attention was paid to the fact that when the silicon nitride film is thinner, the silicon oxide films are likely to extend longer to the active area. In order to prevent this extension, the thickness of the silicon nitride film was made thick, or several layers of silicon nitride were laminated. However, in this technique, the entire silicon nitride film becomes thick so that stress is applied to the Si substrate during selective oxidation and disorder in the crystallinity such as crystal defects is generated.

On the other hand, the improved LOCOS method as shown in FIGS. 5(a) to 5(c) can prevent the active area from being reduced even when the silicon nitride film is relatively thin. This method, however, has a problem that it is difficult to control the film thickness by etching in order to make the partial removal of poly-Si film uniformly. In addition, the method has also a problem that a step of forming poly-Si is required as compared with the above LOCOS method so that the number of producing steps increases.

SUMMARY OF THE INVENTION

The present invention intends to solve these conventional problems and to provide a method of producing a semiconductor device which does not require any complicated step, and prevent the bird's beak from being generated during selective oxidation without giving disorder in crystallinity.

In order to achieve the above object, the present invention is characterized by the steps of: forming an insulating film on a semiconductor substrate; forming a silicon nitride film on the insulating film; patterning a resist film on the silicon nitride film; removing the silicon nitride film using the patterned resist film as a mask so that the thickness of the remaining silicon nitride film becomes small gradually from the center portion to the neighborhood of the ends of the patterned resist film; and selectively oxidizing the substrate using as a mask the silicon nitride film remaining on the semiconductor substrate.

Further, the method of producing a semiconductor device according to the present invention is characterized in that in the step of removing the silicon nitride film, etching is performed several times using the resist pattern as a mask so that the silicon nitride film has a slope from the center portion to its skirt.

In the producing method according to the present invention, by the step of removing the silicon nitride film using the resist film pattern as a mask so that the film thickness is the maximum at its center portion and becomes gradually small downwardly in the neighborhood of the ends of the resist film pattern, a selective oxidation mask made of the silicon nitride film is formed, which has a substantially trapezoid shape in which the film thickness is large at the center portion and becomes gradually small towards the periphery.

In the producing method according to the present invention, etching is performed plural times using the resist film pattern as a mask so that the selective oxidation mask having a slope from the center portion to the skirt is formed.

DETAILED DESCRIPTION OF THE PREFERRED EMBODIMENTS

The present invention will be described in detail in connection with the preferred embodiments.

FIGS. 1(a) to 1(d) are sectional views showing the steps of producing a semiconductor device according to an embodiment of the present invention.

Figure 1A:
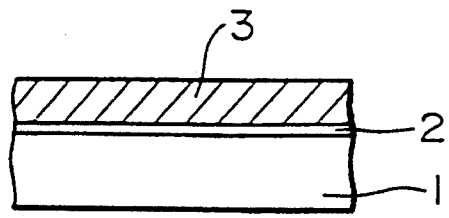
FIGS. 1(a) to 1(d) are schematic sectional views showing the steps of an embodiment of the method of producing a semiconductor device according to the present invention.
Figure 1B:
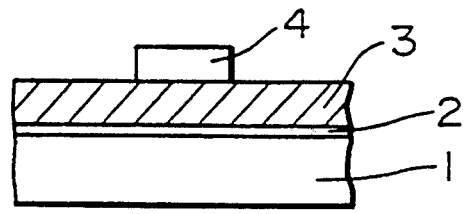

First, an insulating film 2 is formed on a semiconductor substrate 1 (FIG. 1(a)). Although the substrate 1 is made of Si, it is needless to say that the present invention can be applied to a compound semiconductor such as gallium arsenide (GsAs). The insulating film 2 is a silicon oxide film about 100 Å thick, which is formed by oxidizing the substrate. The insulating film 2 may be formed by the chemical vapor deposition (CVD) method other than oxidation.

Figure 1C:
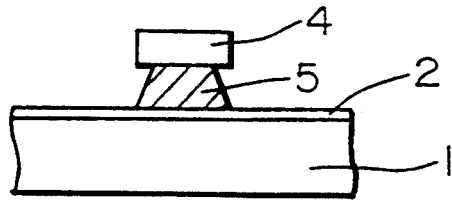
Figure 1D:
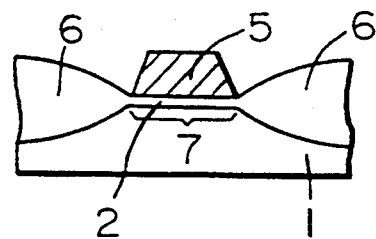

A silicon nitride film 3 is laminated on the insulating film 2 by the CVD method (FIG. 1(a)). On the silicon nitride film 3, resist-patterning is performed (FIG. 1(b)). A resist pattern 4 corresponding to a desired element forming area is formed by photo-etching. Using the resist pattern 4 as a mask, the silicon nitride film 3 is etched (FIG. 1(c)). As shown in FIG. 1(c), isotropic etching is carried out for the silicon nitride film 3 so that more silicon is removed near the lower side of ends of the resist pattern 4 to provide slopes on both sides (taper etching). Thus, the silicon nitride film 5 has a substantially trapezoid shape. The resultant silicon nitride film 5 has a large thickness of the maximum 3000 Å thick at its center portion. Using the trapezoidal silicon nitride film 5 as a mask for oxidation, Si is selectively oxidized by thermal oxidation (FIG. 1(d)). As shown in FIG. 1(d), thick silicon oxide areas 6 serving as element isolation areas are formed through an active area 7. Thereafter, a desired semiconductor device will be produced. For example, an MOS device will be produced by forming source and drain regions by diffusion in the active area 7.

As described above; the silicon nitride film 3 is formed into a trapezoid by the taper etching so that the entire film thickness can be made sufficiently thick with the thick center portion. Thus, it is possible to prevent the bird's beak from being generated. Further, the film thickness becomes small along predetermined slopes in the periphery on both sides of the film so that disorder in crystallinity is not generated. In this embodiment, the ordinary semiconductor manufacturing process can be used by only adding the step of controlling the provision of the silicon nitride film by isotropic etching.

Figure 2A:
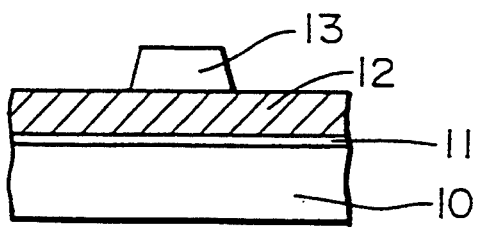
FIGS. 2(a) and 2(b) are schematic sectional views showing the steps of another embodiment of the method of producing a semiconductor device according to the present invention.

FIGS. 2(a) and 2(c) show another embodiment of the step of forming a silicon nitride film according to the present invention.

Figure 2B:
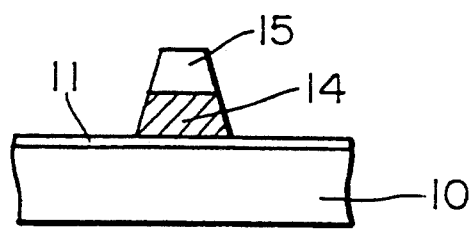

Like the embodiment of FIG. 1 described above, on a semiconductor substrate 10, an insulating film 11 and a silicon nitride film 12 are laminated (FIG. 2(a)). A resist film is applied onto the silicon nitride film 12, and a resist pattern 13 corresponding to a desired element area is formed by photo-etching. In this case, the resist pattern is previously formed into a trapezoid shape. Using the resist pattern as a mask, the silicon nitride film 12 is removed by anisotropic etching together with the resist pattern 13 so that both remaining resist pattern 15 and silicon nitride film 14 are formed into a mountain shape (FIG. 2(b)). In this embodiment, masking control of the silicon nitride film can be done by control of the pattern shape of the resist film.

FIGS. 3(a) to 3(d) show still another embodiment of the step of forming a silicon nitride film.

Figure 3A:
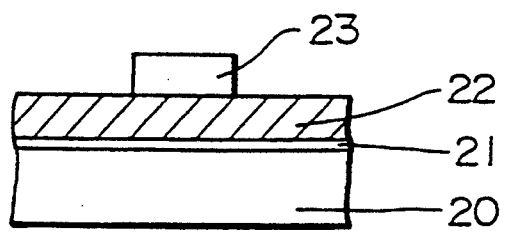
FIGS. 3(a) to 3(d) are schematic sectional views showing the steps of still another embodiment of the method of producing a semiconductor device according to the present invention.

Like the embodiment of FIG. 1 described above, on a semiconductor substrate 20, an insulating film 21 and a silicon nitride film 22 are laminated (FIG. 3(a)). Further, a resist 23 is formed on the silicon nitride film 22.

Figure 3B:
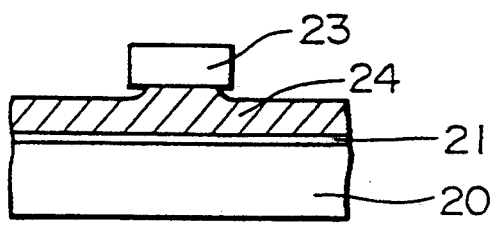
Figure 3C:
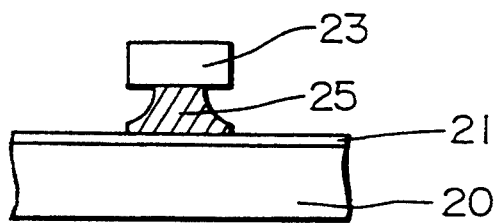
Figure 3D:
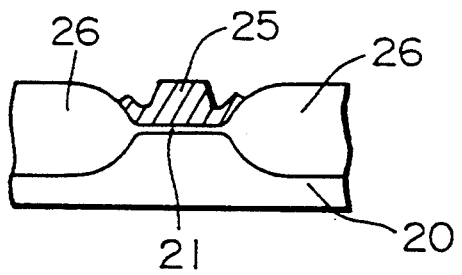
Figure 4A:
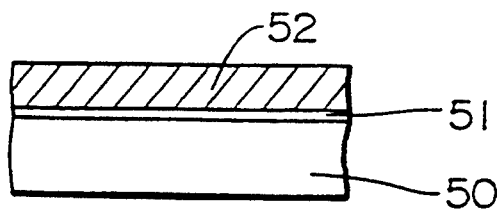
FIGS. 4(a) to 4(c) are schematic sectional views showing a conventional LOCOS method.
Figure 4B:
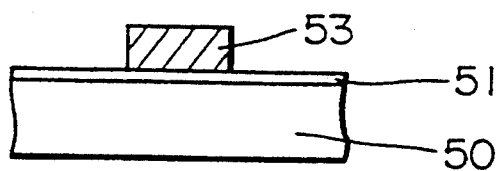
Figure 4C:
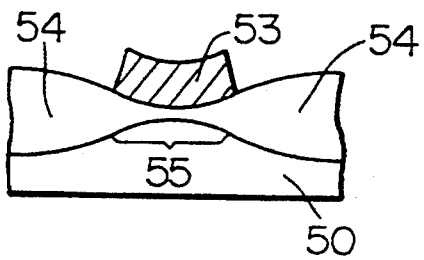
Figure 5A:
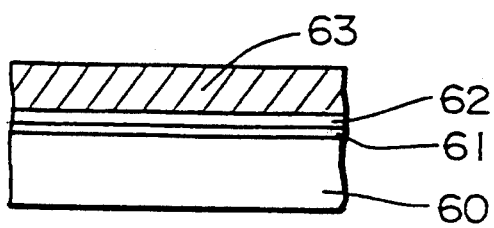
FIGS. 5(a) to 5(c) are schematic sectional views showing another conventional LOCOS method.
Figure 5B:
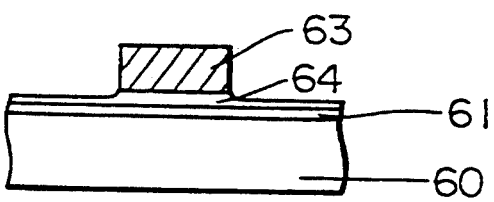
Figure 5C:
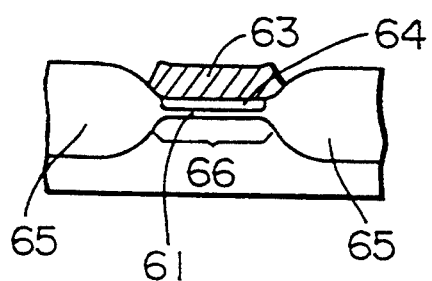

Using the resist 23 as a mask, the silicon nitride film 22 is partially removed by isotropic etching (FIG. 3(b)). Then, the silicon nitride film 22 below the ends of the resist 23 is removed so that its center portion 24 is left. Further, using the resist 23 as a mask, anisotropic etching is carried out to form the silicon nitride film 25 into an inverted T-shape mask having a gentle slope from the periphery of the center portion 24 to the skirt (FIG. 3(c)). If the inverted T-shape mask is used, since contrast in thickness can be obtained between the central portion and periphery of the silicon nitride film 25, element isolation areas 26 in the periphery of which the invasion of bird's beaks is stopped, can be formed.

In this embodiment, since two-stage etching, i.e. the isotropic etching and anisotropic etching are carried out in the process of forming the silicon nitride film, the masking control of the silicon nitride film can be precisely realized by the processing in each stage. Particularly, if the etching is divisionally performed in plural stages, a silicon nitride film mask having a steplike section can be formed so that the slope in the periphery of the film can be more precisely controlled.

Incidentally, in the three embodiments described above, if the surface of the silicon nitride film after the formation of the film is made hydrophilic by using e.g. $H_2O$ to weaken the bonding force of resist to be applied in the subsequent step, the slope in etching the silicon nitride film can be easily formed.

In accordance with the present invention, in the step of forming the silicon nitride film, since a mask for selective oxidation in which the film thickness is large at its center portion and becomes gradually small downwardly from the periphery of the center portion is used, the silicon nitride film with the thickness enough to prevent the bird's beak from being generated at its center portion can be assured. At the ends of the mask, since the film thickness decreases gradually, stress is not applied to the semiconductor substrate during selective oxidation. Thus, a semiconductor device with good crystallinity can be produced.

Further, the masking control of the silicon nitride film can be performed easily and precisely by control of the pattern shape of a resist film, selection of an etching technique or multi-stage etching control. Further, in the formatoion of a silicon nitride film, an etching step has only to be added. Thus, the present invention can be easily applied to the ordinary semiconductor process.

What is claimed is:

1. A method of producing a semiconductor device comprising the steps of:
   forming an insulating film on a semiconductor substrate;
   forming a silicon nitride film on said insulating film;
   forming and patterning a resist film on said silicon nitride film;
   removing said silicon nitride film using said patterned resist film as a mask so that a thickness of a remaining portion of said silicon nitride film becomes small gradually from a first portion under a center of said patterned resist film to a second portion near an end of said patterned resist film; and
   selectively oxidizing said substrate using as a mask said silicon nitride film remaining on said semiconductor substrate,
   wherein said step of removing said silicon nitride film comprises an isotropic etching and an anisotropic etching, said anisotropic etching being performed after said isotropic etching, each of said etching steps using the patterned resist film as a mask so that said silicon nitride film has a slope from said first portion to said second portion.

2. A method of producing a semiconductor device comprising the steps of:

forming an insulating film on a semiconductor substrate;

forming a silicon nitride film on said insulating film;

forming and patterning a resist film on said silicon nitride film;

removing said silicon nitride film using said patterned resist film as a mask so that a thickness of a remaining portion of said silicon nitride film becomes small gradually from a first portion under a center of said patterned resist film to a second portion near an end of said patterned resist film; and selectively oxidizing said substrate using as a mask said silicon nitride film remaining on said semiconductor substrate, wherein after formation of said silicon nitride film, a surface of said silicon nitride film is made hydrophilic.

3. A method of producing a semiconductor device according to claim 2, wherein said step of removing said silicon nitride film comprises isotropic etching.

4. A method of producing a semiconductor device according to claim 2, said step of patterning said resist film comprises a photo-etching to form a trapezoid-shaped resist pattern, and said step of removing said silicon nitride film comprises an anisotropic etching.

5. A method of producing a semiconductor device according to claim 2, wherein said step of removing said silicon nitride film comprises a plurality of etching steps each using said patterned resist film as a mask so that said silicon nitride film has a slope from said first portion to said second portion.

* * * * *